United States Patent
Ikeda

(10) Patent No.: US 6,680,510 B2
(45) Date of Patent: Jan. 20, 2004

(54) NON-VOLATILE MEMORY DEVICE HAVING A CELL TRANSISTOR AND A NON-CELL TRANSISTOR

(75) Inventor: Osamu Ikeda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/996,753

(22) Filed: Nov. 30, 2001

(65) Prior Publication Data

US 2002/0034851 A1 Mar. 21, 2002

Related U.S. Application Data

(62) Division of application No. 09/523,176, filed on Mar. 10, 2000, now Pat. No. 6,335,244.

(30) Foreign Application Priority Data

Mar. 12, 1999 (JP) ............................................ 11-067441

(51) Int. Cl.[7] .............................................. H01L 29/792
(52) U.S. Cl. ........................ 257/326; 257/315; 438/258
(58) Field of Search ................................ 257/314, 315, 257/316, 319, 320, 326; 438/200, 201, 258, 266, 257, 275, 279, 587, 593

(56) References Cited

U.S. PATENT DOCUMENTS

| | | | | |
|---|---|---|---|---|
| 4,367,580 A | * | 1/1983 | Guterman | ................ 438/238 |
| 5,326,999 A | | 7/1994 | Kim et al. | |
| 5,789,293 A | * | 8/1998 | Cho et al. | ................ 438/257 |
| 5,846,861 A | | 12/1998 | Saitoh | |
| 6,268,247 B1 | | 7/2001 | Cremonesi et al. | |
| 6,291,853 B1 | * | 9/2001 | Io | ................ 257/315 |

* cited by examiner

*Primary Examiner*—Jack Chen
(74) *Attorney, Agent, or Firm*—Oblon, Spivak, McClelland, Maier & Neustadt, P.C.

(57) ABSTRACT

A nonvolatile semiconductor memory device has a cell transistor and a non-cell transistor which are covered with an interlayer insulator film (228). The non-cell transistor has a first insulator film (212) formed on a semiconductor substrate (210); a first gate electrode (214b) formed on the first insulator film; a second insulator film (216b) formed on the first gate electrode in a first area of the gate electrode, the first area being a part of the first gate electrode; a second gate electrode (218b) formed on the second insulator film; and a contact portion (234) embedded in a contact hole (232) of the interlayer insulator film (228) to contact the first gate electrode in a second area of the first gate electrode, wherein the second insulator film is not formed on the second area and the contact portion is out of contact with the second insulator film.

12 Claims, 16 Drawing Sheets

REGION FOR CELL TRANSISTOR

REGION FOR PERIPHERAL TRANSISTOR OR SELECT TRANSISTOR

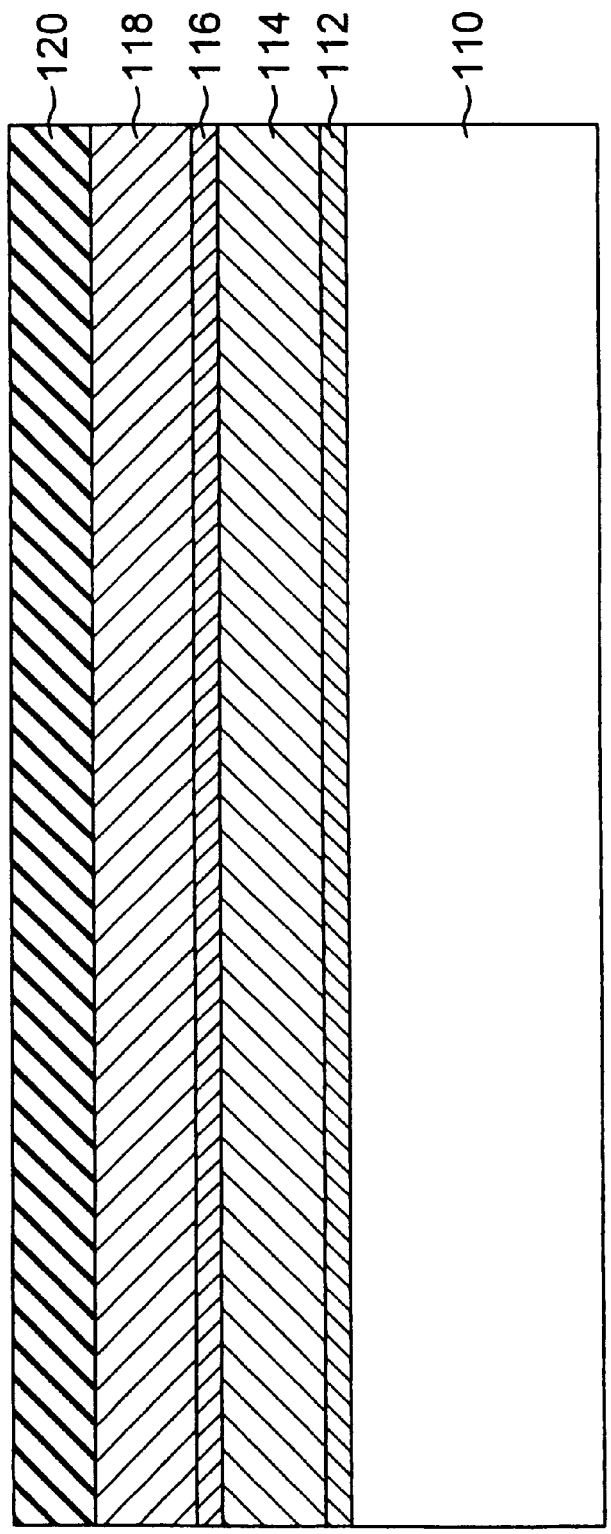
F I G. 1

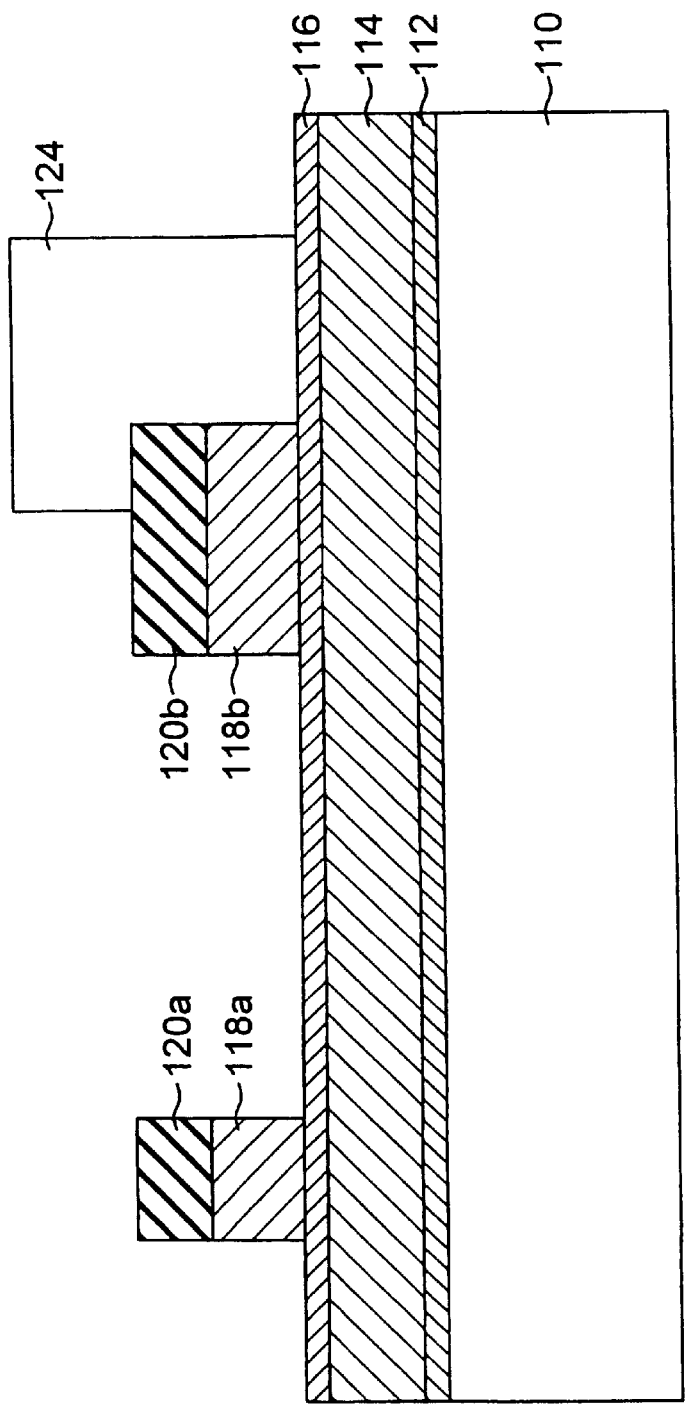
F I G. 3

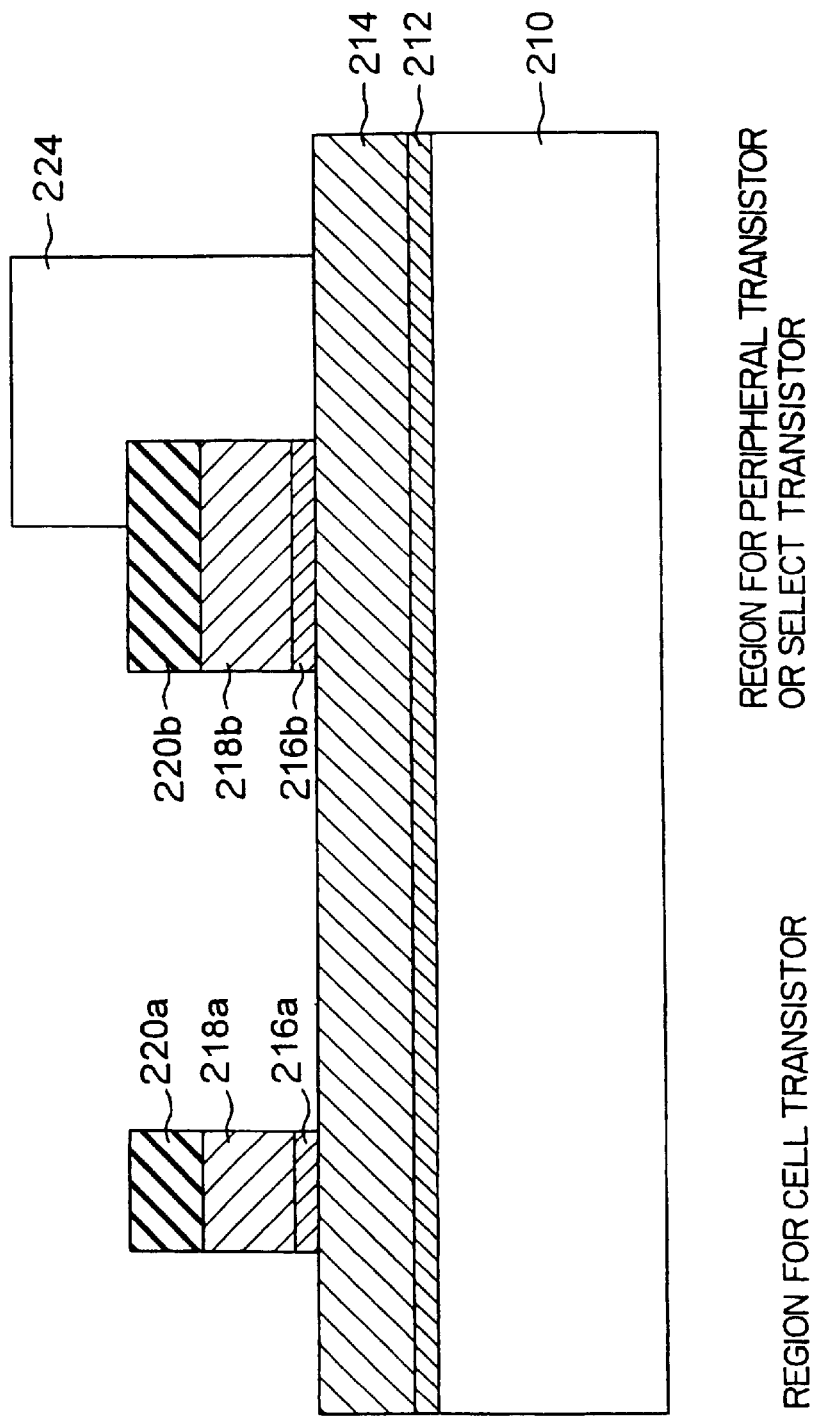
F I G. 12

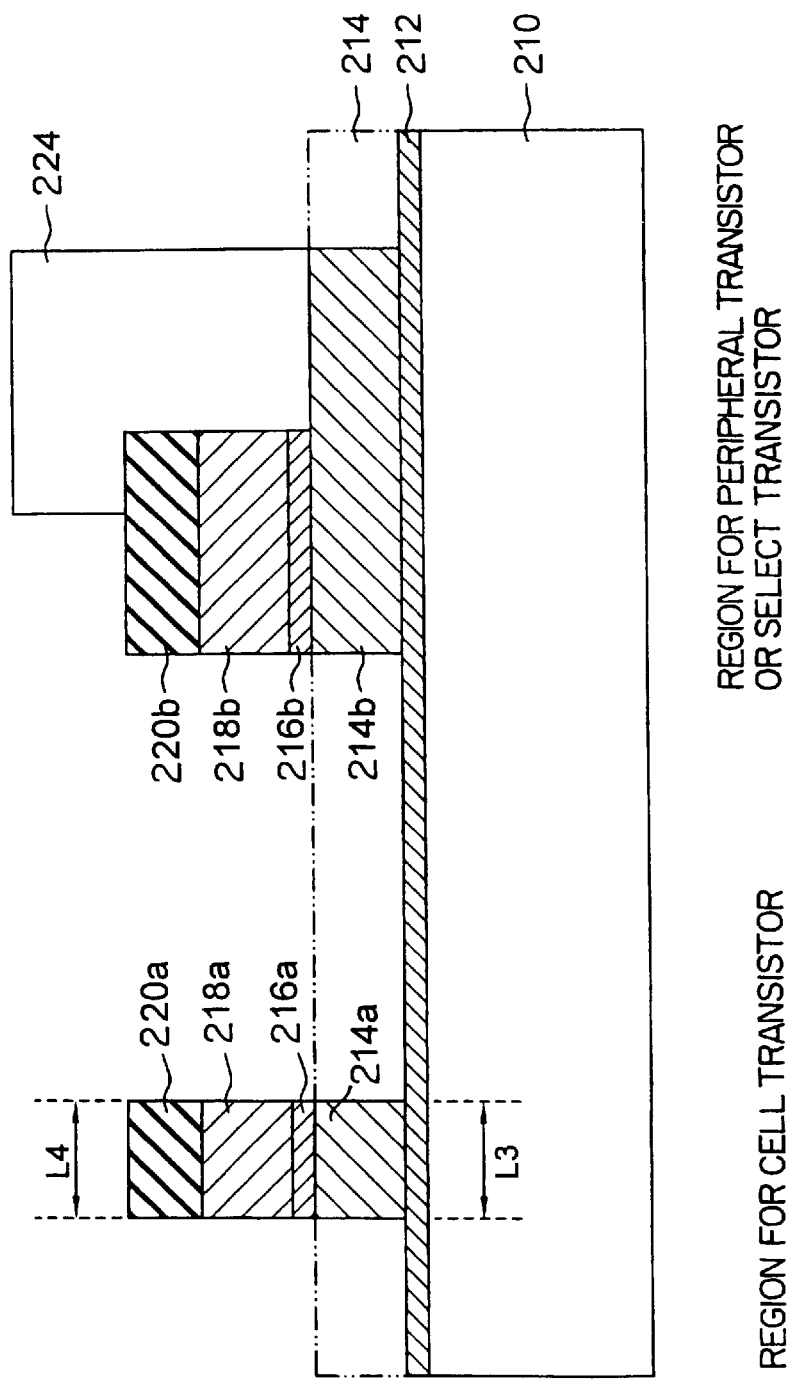
F I G. 13

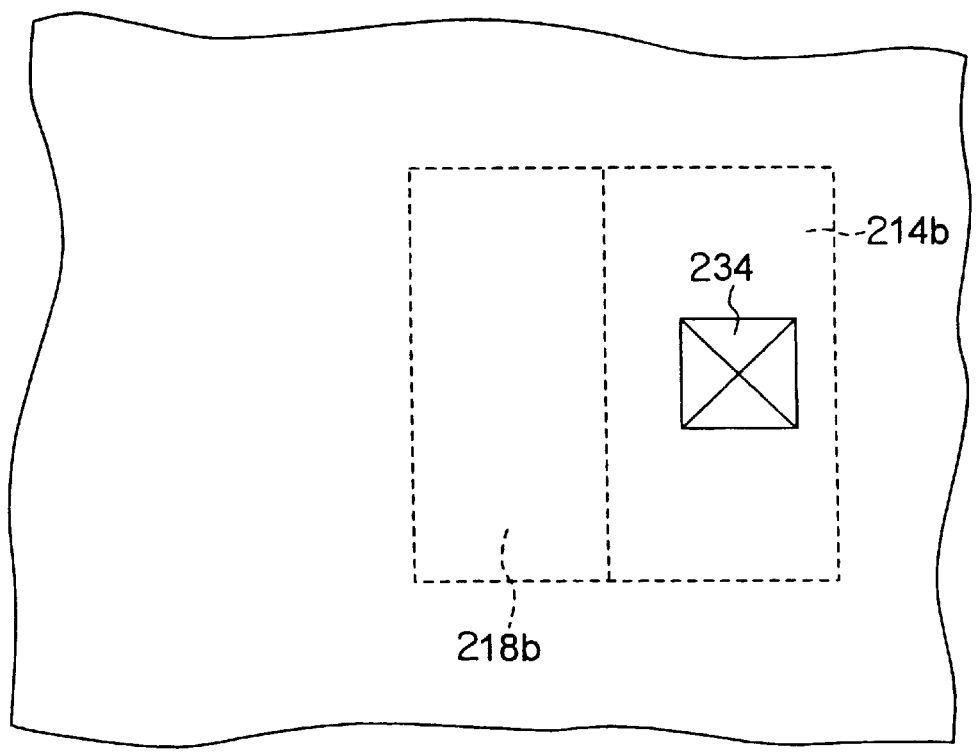
F I G. 16

NON-VOLATILE MEMORY DEVICE HAVING A CELL TRANSISTOR AND A NON-CELL TRANSISTOR

This application is a division of application Ser. No. 09/523,176, filed Mar. 10, 2000, now U.S. Pat. No. 6,335,244, the disclosure of which is herein incorporated by reference.

RELATED APPLICATION

This application claims benefit of priority under 35 U.S.C. §119 to Japanese Patent Application No. H11-67441, filed on Mar. 12, 1999, the entire contents of which are incorporated by reference herein.

BACKGROUND OF THE INVENTION

1. Field of the Invention

The present invention relates generally to a nonvolatile semiconductor memory device, and a method for producing the same. More specifically, the invention relates to a nonvolatile semiconductor memory device having a stacked gate type transistor, and a method for producing the same.

2. Description of the Related Background

A typical nonvolatile semiconductor memory device is provided with a cell transistor forming region for forming a cell transistor for nonvolatilisably accumulating charges, a selecting transistor forming region for forming a selecting transistor for selectively operating the cell transistor, and a peripheral transistor forming region for forming a peripheral transistor for the cell transistor and the selecting transistor.

The cell transistor has a two-layer structure which comprises a first polysilicon layer constituting a floating gate, and a second polysilicon layer constituting a control gate. Therefore, in order to flatten the surface of a nonvolatile semiconductor memory device, it is desired that the peripheral transistor and the selecting transistor have a two-layer structure. That is, it is desired that the height of the cell transistor in the cell transistor forming region is the same as the height of the selecting transistor in the selecting transistor forming region. Moreover, it is desired that the height of the cell transistor in the cell transistor forming region is the same as the height of the selecting transistor in the peripheral transistor forming region.

SUMMARY OF THE INVENTION

According to one aspect of the present invention, a method for producing a nonvolatile semiconductor memory device comprising: a cell transistor which is formed on a semiconductor substrate and which has a cell insulator film, a floating gate, a first intergate insulator film, a control gate and a cell mask film; and a transistor which is formed on said semiconductor substrate and which has a transistor insulator film, a first gate electrode, a second intergate insulator film, a second gate electrode and a transistor mask film, said method comprising:

sequentially forming a first insulator film, a first conductive film, a second insulator film, a second conductive film and a mask film on a semiconductor substrate;

patterning said mask film to form said cell mask film and said transistor mask film;

etching said second conductive film and said second insulator film using said cell mask film and said transistor mask film as masks to form said control gate and said second gate electrode and to form said first intergate insulator film and said second intergate insulator film;

forming a resist pattern so that a part of said resist pattern overlaps with said transistor mask film; and etching said first conductive film using said cell mask film, said transistor mask film and said resist pattern as masks to form said floating gate and said first gate electrode.

According to another aspect of the present invention, a nonvolatile semiconductor memory device having a cell transistor and a non-cell transistor which are covered with an interlayer insulator film, wherein said non-cell transistor comprises:

a first insulator film formed on a semiconductor substrate;

a first gate electrode formed on said first insulator film;

a second insulator film formed on said first gate electrode in a first area of said gate electrode, said first area being a part of said first gate electrode;

a second gate electrode formed on said second insulator film; and a contact portion embedded in a contact hole of said interlayer insulator film to contact said first gate electrode in a second area of said first gate electrode, wherein said second insulator film is not formed on said second area and said contact portion is out of contact with said second insulator film.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a sectional view showing a part of a process for producing the first preferred embodiment of a nonvolatile semiconductor memory device according to the present invention;

FIG. 3 is a sectional view showing a part of a process for producing the first preferred embodiment of a nonvolatile semiconductor memory device according to the present invention;

FIG. 12 is a sectional view showing a part of a process for producing the second preferred embodiment of a nonvolatile semiconductor memory device according to the present invention;

FIG. 13 is a sectional view showing a part of a process for producing the second preferred embodiment of a nonvolatile semiconductor memory device according to the present invention;

FIG. 16 is a plan view of the nonvolatile semiconductor memory device of FIG. 15, which is viewed from the top.

DESCRIPTION OF THE PREFERRED EMBODIMENTS

First Preferred Embodiment

Referring now to the accompanying drawings, particularly to FIGS. 1 through 8, the art as a premise of the present invention will be described below.

FIGS. 1 through 8 show the art which is personally known by the inventor and which is not publicly known.

Figure 5:
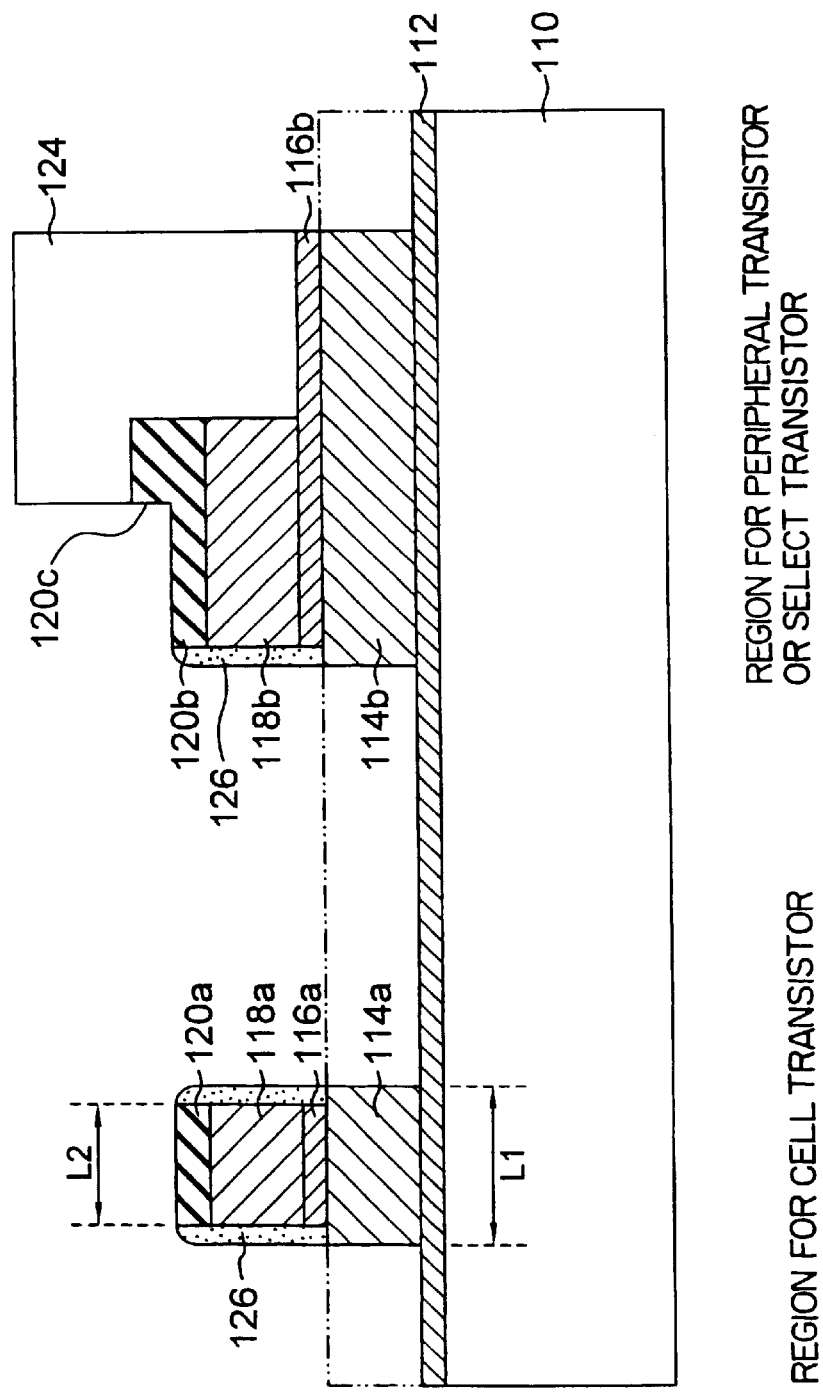
FIG. 5 is a sectional view showing a part of a process for producing the first preferred embodiment of a nonvolatile semiconductor memory device according to the present invention.
Figure 6:
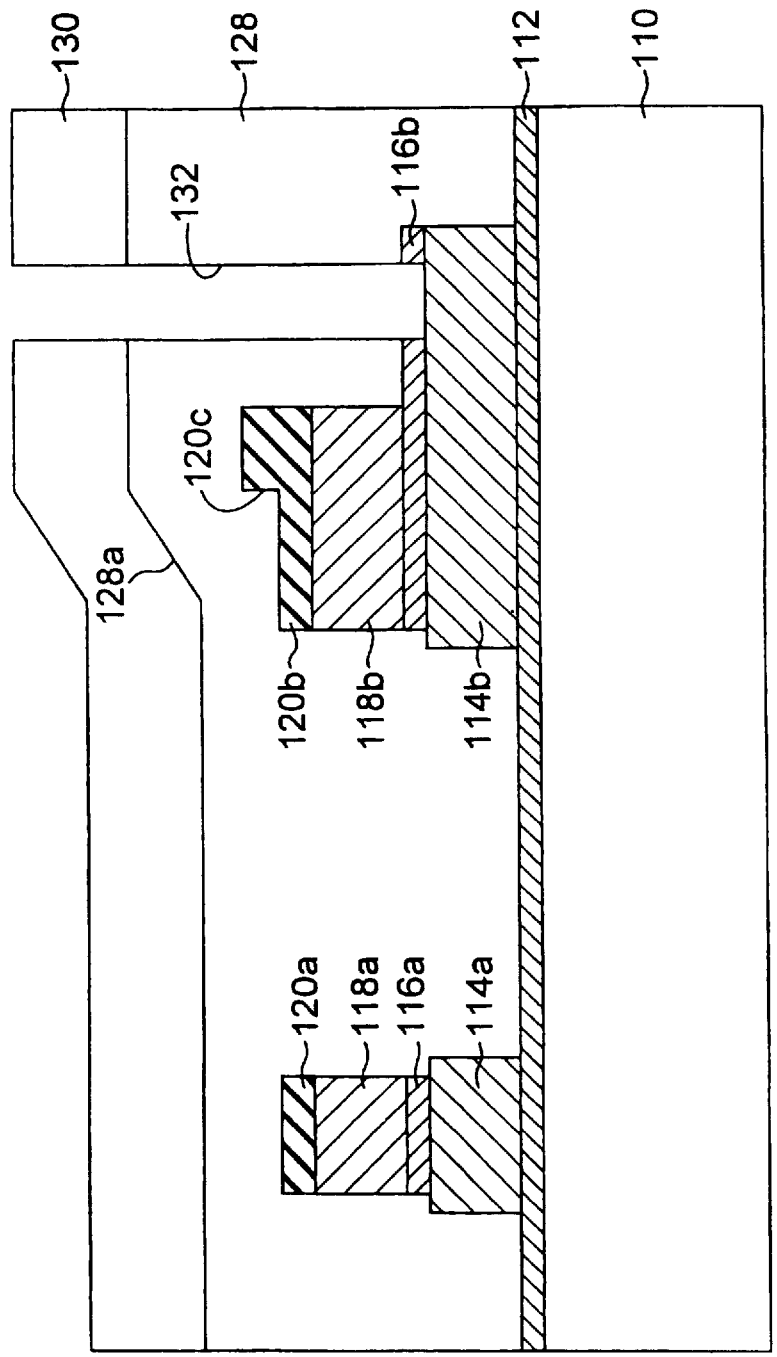
FIG. 6 is a sectional view showing a part of a process for producing the first preferred embodiment of a nonvolatile semiconductor memory device according to the present invention.
Figure 7:
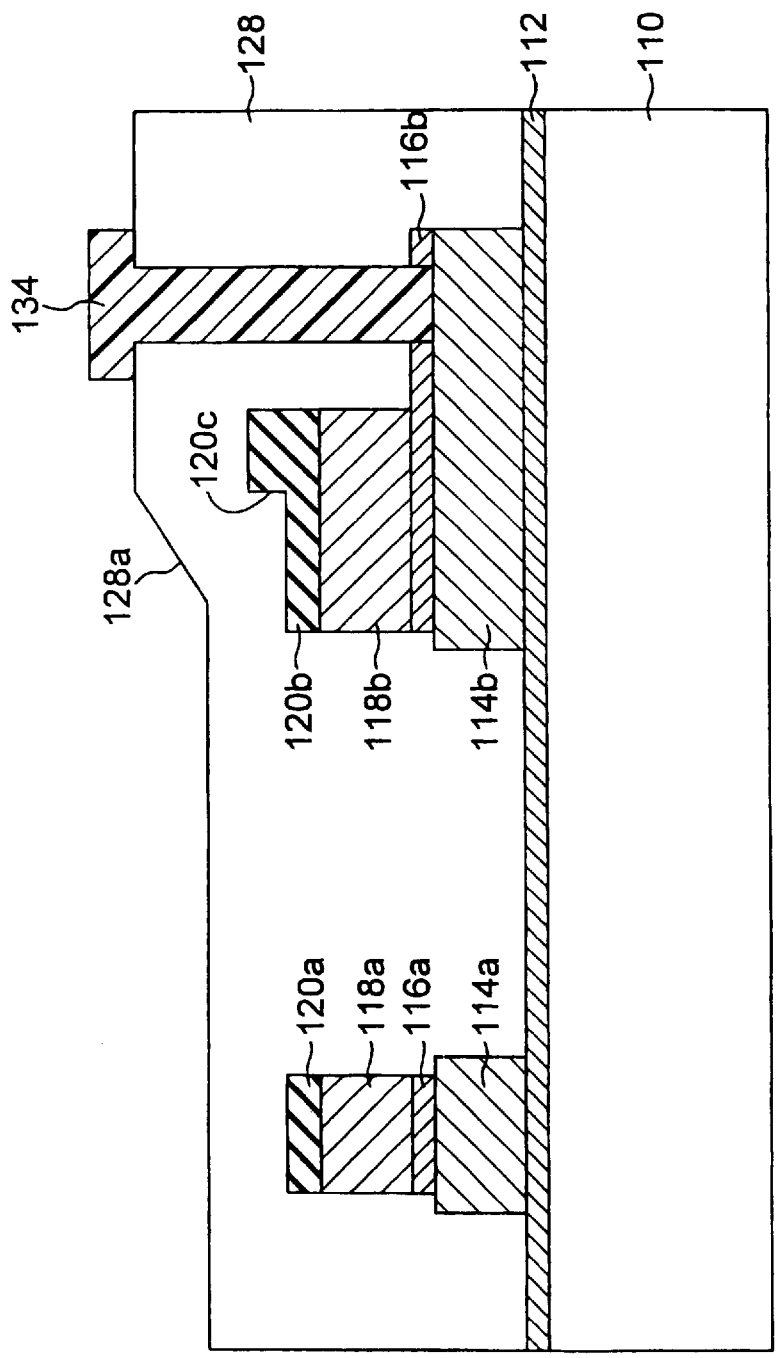
FIG. 7 is a sectional view of the first preferred embodiment of a nonvolatile semiconductor memory device according to the present invention.
Figure 8:
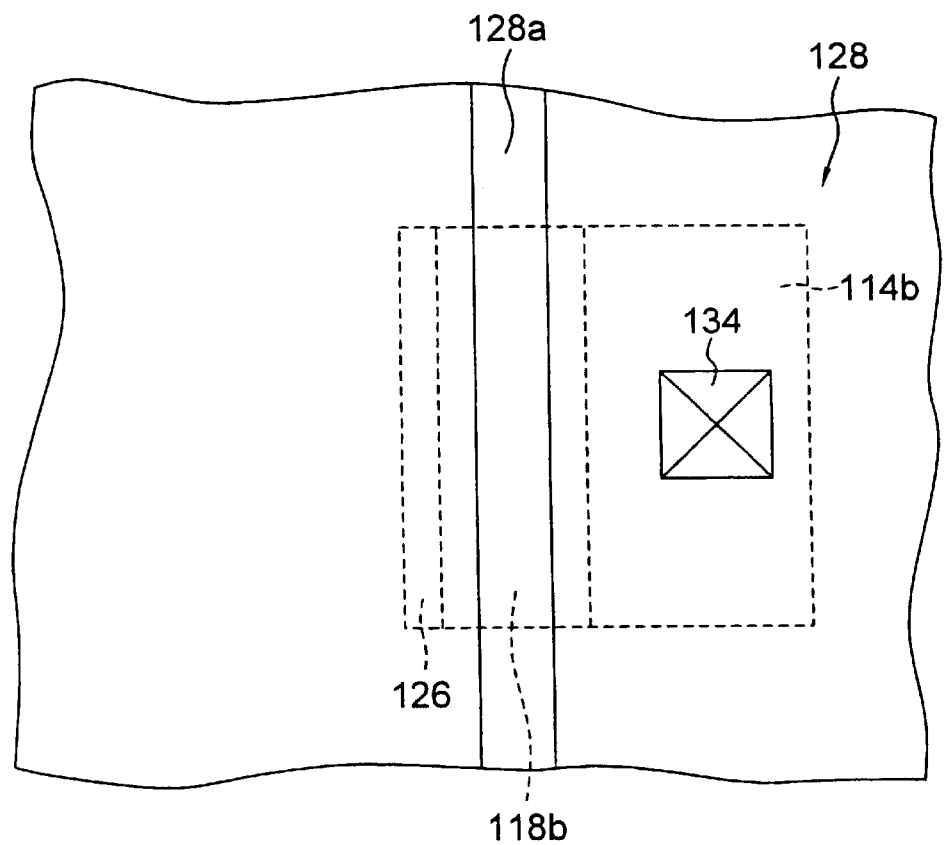
FIG. 8 is a plan view of the nonvolatile semiconductor memory device of FIG. 7, which is viewed from the top.

FIGS. 1 through 7 are sectional views showing a process for producing the first preferred embodiment of a nonvolatile semiconductor memory device according to the present invention, and FIG. 8 is a plan view which is viewed from the top in FIG. 7. In FIGS. 1 through 7, a cell transistor forming region is shown on the left side, and a peripheral transistor forming region and/or a selecting transistor forming region is shown on the right side.

First, as shown in FIG. 1, a gate oxide film 112 is formed on a semiconductor substrate 110 of a silicon substrate by the thermal oxidation or the like. Subsequently, a first polysilicon layer 114 having a desired value of resistance is formed on the gate oxide film 112 by the chemical vapor deposition (CVD) or the like.

Then, an oxide-nitride-oxide (ONO) insulator film 116 is formed on the first polysilicon layer 114. For example, the formation of the ONO insulator film 116 is carried out by forming a lower oxide film by the thermal oxidation, forming a nitride film by the low pressure CVD (LP-CVD), and forming an upper oxide film by the thermal oxidation. Subsequently, a second polysilicon layer 118 having a desired value of resistance is formed on the ONO insulator film 116 by the CVD or the like. Subsequently, a mask insulator film 120 of an oxide or nitride film is formed on the second polysilicon layer 118 by the CVD or the like.

Figure 2:
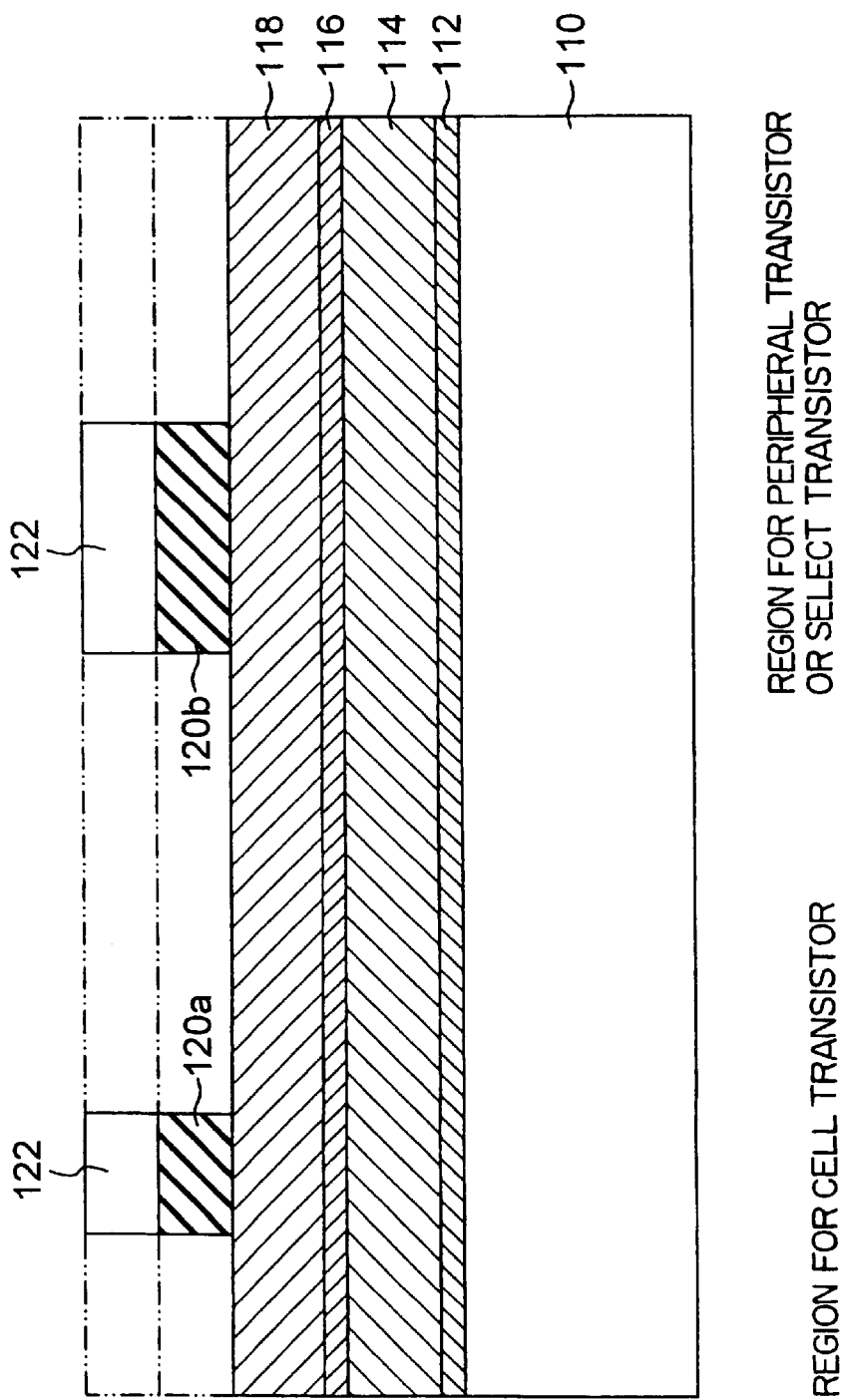
FIG. 2 is a sectional view showing a part of a process for producing the first preferred embodiment of a nonvolatile semiconductor memory device according to the present invention.

Then, as shown in FIG. 2, a resist is applied on the mask insulator film 120 and patterned by the photo lithography to form a resist pattern 122. Subsequently, the mask insulator film 120 is patterned by the reactive ion etching (RIE) using the resist pattern 122 as a mask. Thus, mask insulator films 120a and 120b are formed.

Then, as shown in FIG. 3, the resist pattern 122 is removed. Subsequently, the second polysilicon layer 118 is patterned by the RIE or the like using the mask insulator films 120a and 120b as masks to form a control gate 118a and a second gate electrode 118b. Subsequently, a resist is applied thereon and patterned by the photo lithography to form a resist pattern 124. That is, the resist pattern 124 for forming a first gate electrode is formed in a peripheral transistor forming region and/or a selecting transistor forming region. The resist pattern 124 is designed so as to cover a part of the mask insulator film 120b taking account of a mating margin.

Figure 4:
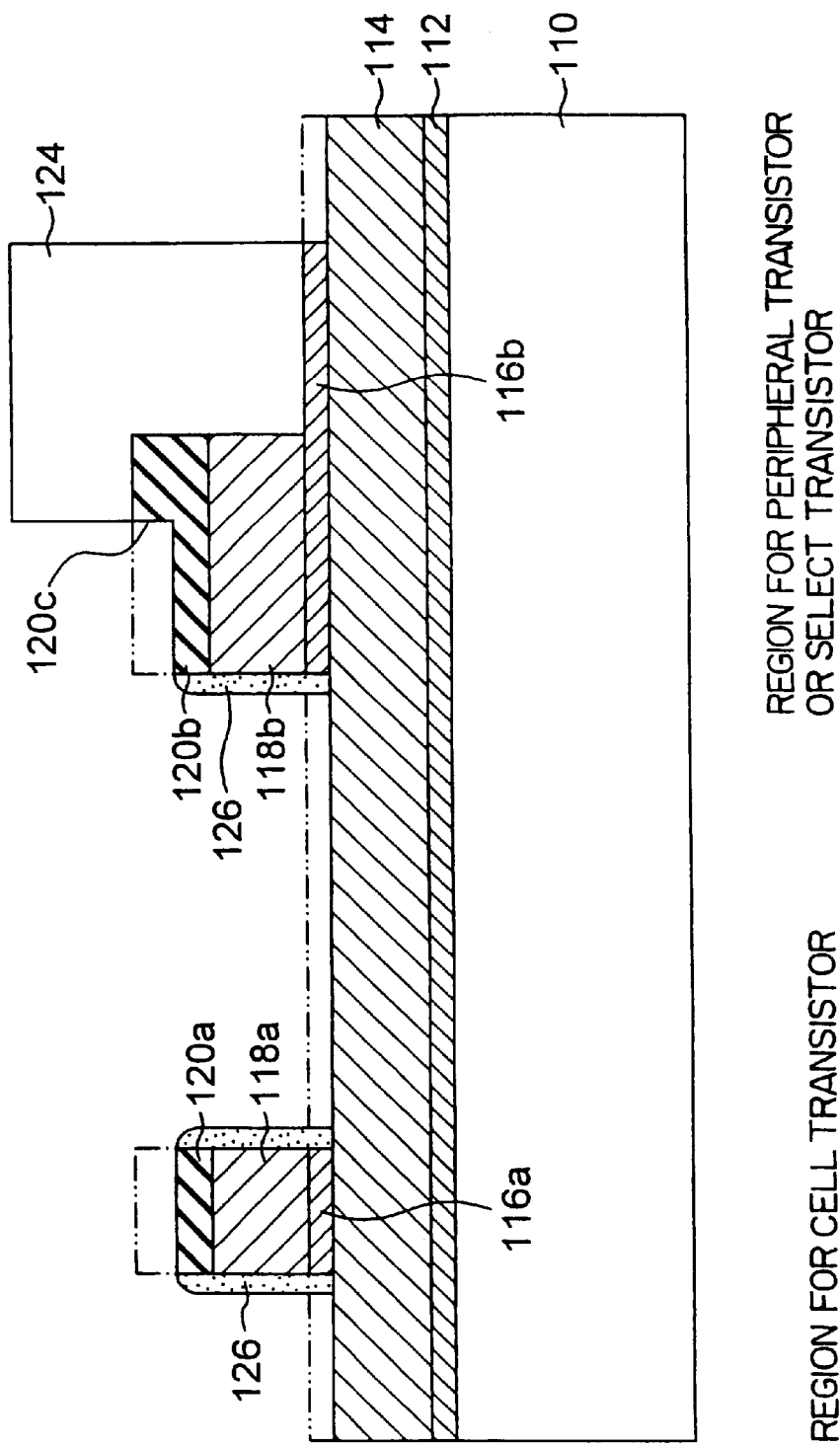
FIG. 4 is a sectional view showing a part of a process for producing the first preferred embodiment of a nonvolatile semiconductor memory device according to the present invention.

Then, as shown in FIG. 4, the ONO insulator film 116 is etched by the RIE or the like using the resist pattern 124 as a mask. By this etching, intergate insulator films 116a and 116b are formed. During the etching, part of the mask insulator films 120a and 120b are also etched since the materials thereof are similar to the material of the ONO insulator film 116. That is, the mask insulator film 120a in a cell transistor forming region is etched as a whole, so that the thickness thereof decreases. On the other hand, the mask insulator film in the peripheral transistor forming region and/or the selecting transistor region is partially etched due to the presence of the resist 124, so that a difference 120c in level is formed.

When the ONO insulator film 116 is etched, deposits 126 are formed on the side walls of the mask insulator films 120a and 120b, the side walls of the control gate 118a and second gate electrode 118b, and the side walls of the intergate insulator films 116a and 116b. The deposits 126 can be removed by the ashing and wet treatment. However, if such treatments are carried out, the resist pattern 124 is also removed, so that the deposits 126 can not be removed at this time. In addition, the resist pattern 124 can not be removed at this time since the resist pattern 124 is necessary for the etching of the first polysilicon layer 114 as described below. Therefore, in this state, the next treatment is carried out.

That is, as shown in FIG. 5, the first polysilicon layer 114 is etched by the RIE or the like to form a floating gate 114a and a first gate electrode 114b. At this time, the deposits 126 also serve as masks, so that the width of the floating gate 114a is greater than the width of the control gate 118a.

Then, as shown in FIG. 6, the resist pattern 124 is removed. At this time, the deposits 126 are also removed. Subsequently, an interlayer insulator film 128 is formed thereon. On the interlayer insulator film 128, a difference 128a in level is formed above the mask insulator film 120b. Subsequently, a resist is applied on the interlayer insulator film 128 and patterned by the photo lithography to form a resist pattern 130. Then, the interlayer insulator film 128 and the intergate insulator film 116b are etched by the RIE or the like using the resist pattern 130. By this etching, a contact hole 132 is formed.

Then, as shown in FIG. 7, the resist pattern 130 is removed. Subsequently, a third polysilicon layer having a desired value of resistance is formed to be embedded in the contact hole 132 and patterned to form a contact portion 134. As shown in FIG. 8 which is viewed from the top of FIG. 7, a difference 128a in level is formed on the second gate electrode 118b in the interlayer insulator film 128.

As can be seen from the foregoing, according to the nonvolatile semiconductor memory device in the first preferred embodiment, the peripheral transistor and/or selecting transistor comprises the first gate electrode 114b formed of the first polysilicon layer 114, and the second gate electrode 118b formed of the second polysilicon layer 118 similar to the cell transistor. Therefore, the surface of the nonvolatile semiconductor memory device can be flatter than that when the peripheral transistor and/or selecting transistor is not provided with the second gate electrode 118b.

However, in the above described process for producing the nonvolatile semiconductor memory device, there are the following problems.

First, as shown in FIG. 4, there is a problem in that the deposits 126 are formed. That is, there is a problem in that the deposits 126 are formed on the side walls of the mask insulator films 120a and 120b, the side walls of the control gate 118a and second gate electrode 118b and the side walls of the intergate insulator films 116a and 116b when the ONO insulator film 116 is etched. If the deposits 126 are thus formed, the deposits 126 serve as masks, so that there is a problem in that the width(length) L1 of the floating gate 114a is longer than the width(length) L2 of the control gate 118a as shown in FIG. 5. That is, there is a problem in that the gate dimension increases.

Moreover, the degree of adhesion of the deposits 126 is not always constant. Therefore, there is a problem in that the sizes of the floating gate 114a and first gate electrode 114b vary in accordance with the degree of adhesion of the deposits 126.

Secondly, as shown in FIG. 4, there is a problem in that the difference 120c in level is formed in the mask insulator film 120b. If such a difference 120c in level exists, there is a problem in that the difference 128a in level is formed as shown in FIG. 7 when the interlayer insulator film 128 is formed. If such a difference 128a in level exists, there is a problem in that it is difficult to align the mask for the photo lithography when the contact hole 132 is formed in the interlayer insulator film 128 as shown in FIG. 6. In addition, since light is scattered on a portion having the difference 128 in level during the lithography, the margin of focus decreases, so that there is a problem in that the resist mask can not be patterned with required precision.

Thirdly, since the resist pattern 124 is formed on the ONO insulator film 116 as shown in FIG. 3, there is a problem in that adhesion between both is bad. Therefore, there is a problem in that the resist pattern 124 is peeled off and the resist flies off.

Second Preferred Embodiment

In order to eliminate the above described problems in the first preferred embodiment, the second preferred embodiment of the present invention has been made. In the second preferred embodiment, it is an object to provide a method for producing a nonvolatile semiconductor memory device, which can remove deposits 126 formed on the side walls of mask insulator films 120a and 120b, the side walls of a control gate 118a and second gate electrode 118b, and the side walls of intergate insulator films 116a and 116b when an ONO insulator film 116 is etched, and a nonvolatile semiconductor memory device produced by this method. It is another object to provide a nonvolatile semiconductor memory device wherein an interlayer insulator film 128 has no difference in level, and a method for producing the same. It is a further object to provide a method for producing a nonvolatile semiconductor memory device wherein a resist pattern 124 is not peeled off and a resist does not fly off, and a nonvolatile semiconductor memory device produced by this method.

That is, in the second preferred embodiment, after a second polysilicon layer and an ONO insulator film are etched using a mask insulator film, the photo lithography for leaving a first gate is carried out to form a resist mask in a peripheral transistor forming region and/or peripheral transistor forming region, and then, a first polysilicon layer is patterned using the resist mask and a mask insulator film as masks. Thus, the width of the first polysilicon layer and the width of the second polysilicon layer are matched with each other, so that it is prevent an interlayer insulator film from having a difference in level and it is possible to prevent a resist from flying off.

Referring to FIGS. 9 through 16, a process for producing the second preferred embodiment of a nonvolatile semiconductor memory device according to the present invention will be described below. FIGS. 9 through 15 are sectional views showing a process for producing the second preferred embodiment of a nonvolatile semiconductor memory device according to the present invention, and FIG. 16 is a plan view which is viewed from the top in FIG. 15. In FIGS. 9 through 15, a cell transistor forming region is shown on the left side, and a peripheral transistor forming region and/or a selecting transistor forming region is shown on the right side. The peripheral transistor forming region and/or the selecting transistor forming region are/is non-cell transistor forming regions in this preferred embodiment.

Figure 9:
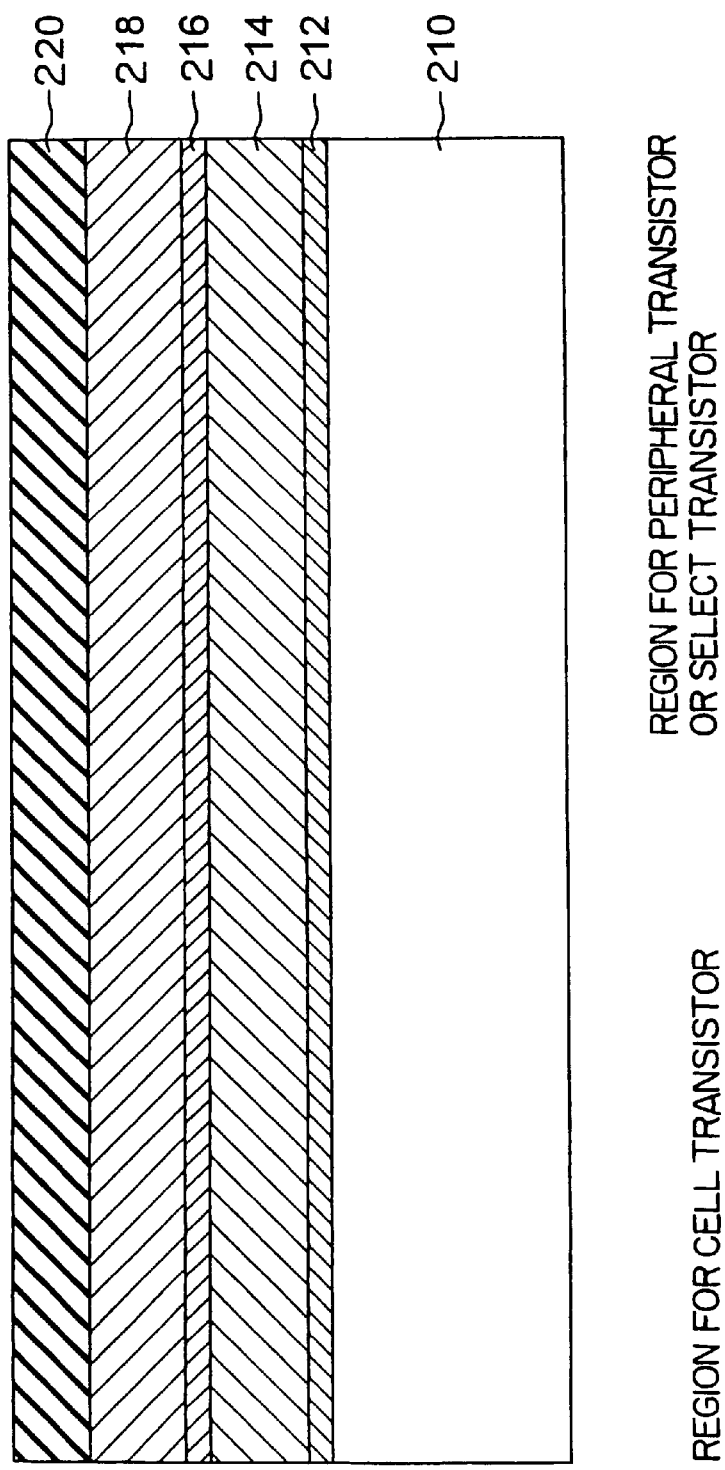
FIG. 9 is a sectional view showing a part of a process for producing the second preferred embodiment of a nonvolatile semiconductor memory device according to the present invention.

First, as shown in FIG. 9, a gate oxide film 212 is formed on a semiconductor substrate 210 of a silicon substrate by the thermal oxidation or the like. This gate insulator film constitutes a first insulator film in this preferred embodiment. Subsequently, a first polysilicon layer 214 having a desired value of resistance is formed on the gate oxide film 212 by the chemical vapor deposition (CVD) or the like. That is, the impurity doped first polysilicon layer 214 is formed.

Then, an oxide-nitride-oxide (ONO) insulator film 216 is formed on the first polysilicon layer 214. For example, the formation of the ONO insulator film 216 is carried out by forming a lower oxide film by the thermal oxidation, forming a nitride film by the low pressure CVD (LP-CVD), and forming an upper oxide film by the thermal oxidation. This ONO insulator film constitutes a second insulator film in this preferred embodiment. Subsequently, a second polysilicon layer 218 having a desired value of resistance is formed on the ONO insulator film 216 by the CVD or the like. That is, the impurity doped second polysilicon layer 218 is formed. Subsequently, a mask insulator film 220 of an oxide or nitride film is formed on the second polysilicon layer 218 by the CVD or the like. The mask insulator film 220 of the oxide film is, e.g., $SiO_2$ film, and the mask insulator film 220 of the nitride film is, e.g., $Si_3N_4$.

Figure 10:
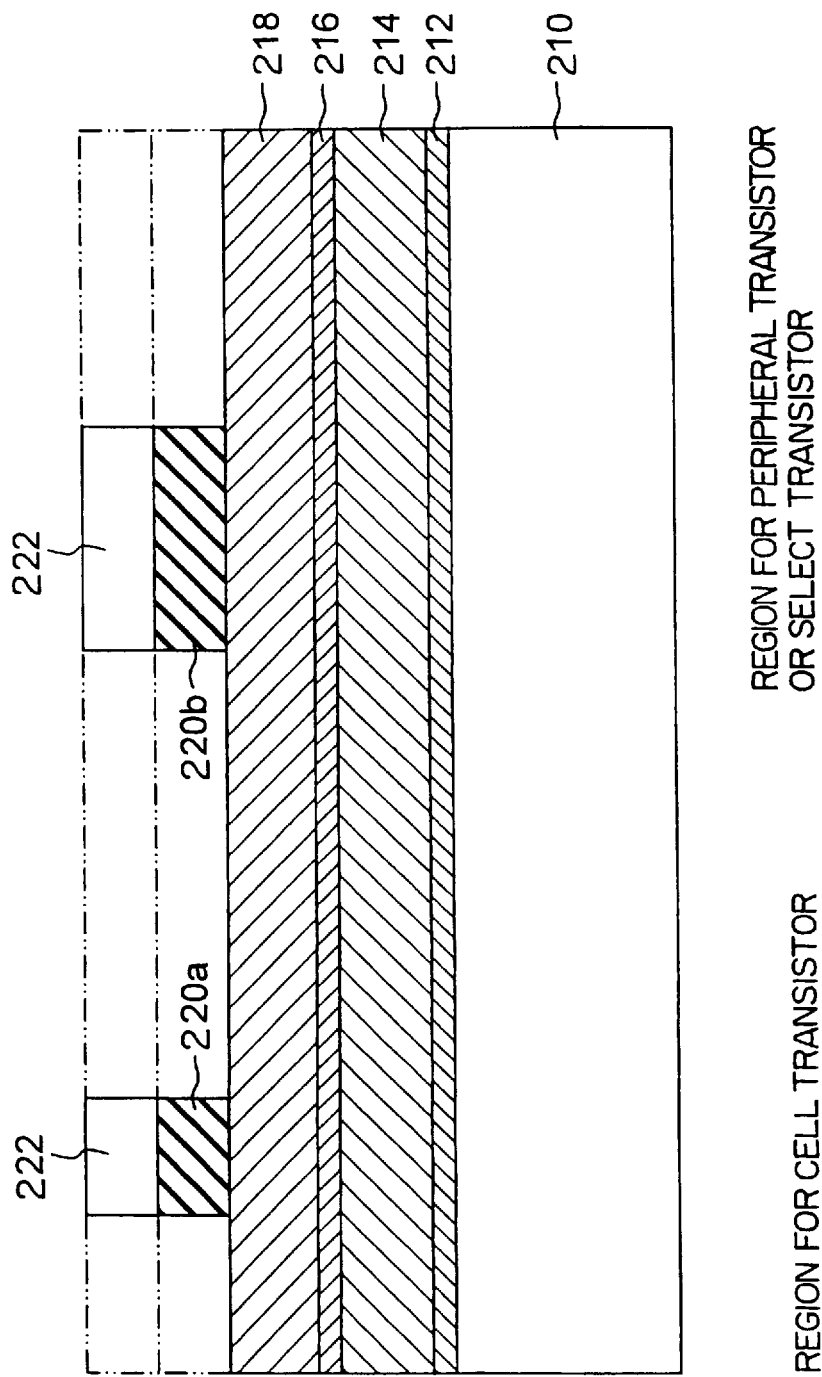
FIG. 10 is a sectional view showing a part of a process for producing the second preferred embodiment of a nonvolatile semiconductor memory device according to the present invention.

Then, as shown in FIG. 10, a resist is applied on the mask insulator film 220 and patterned by the photo lithography to form a resist pattern 222. Subsequently, the mask insulator film 220 is patterned by the reactive ion etching (RIE) using the resist pattern 222 as a mask. Thus, mask insulator films 220a and 220b are formed. The mask insulator film 220a constitutes a mask insulator film for a cell transistor in this preferred embodiment, and the mask insulator film 220b constitutes a mask insulator film for a second gate electrode in this preferred embodiment.

Figure 11:
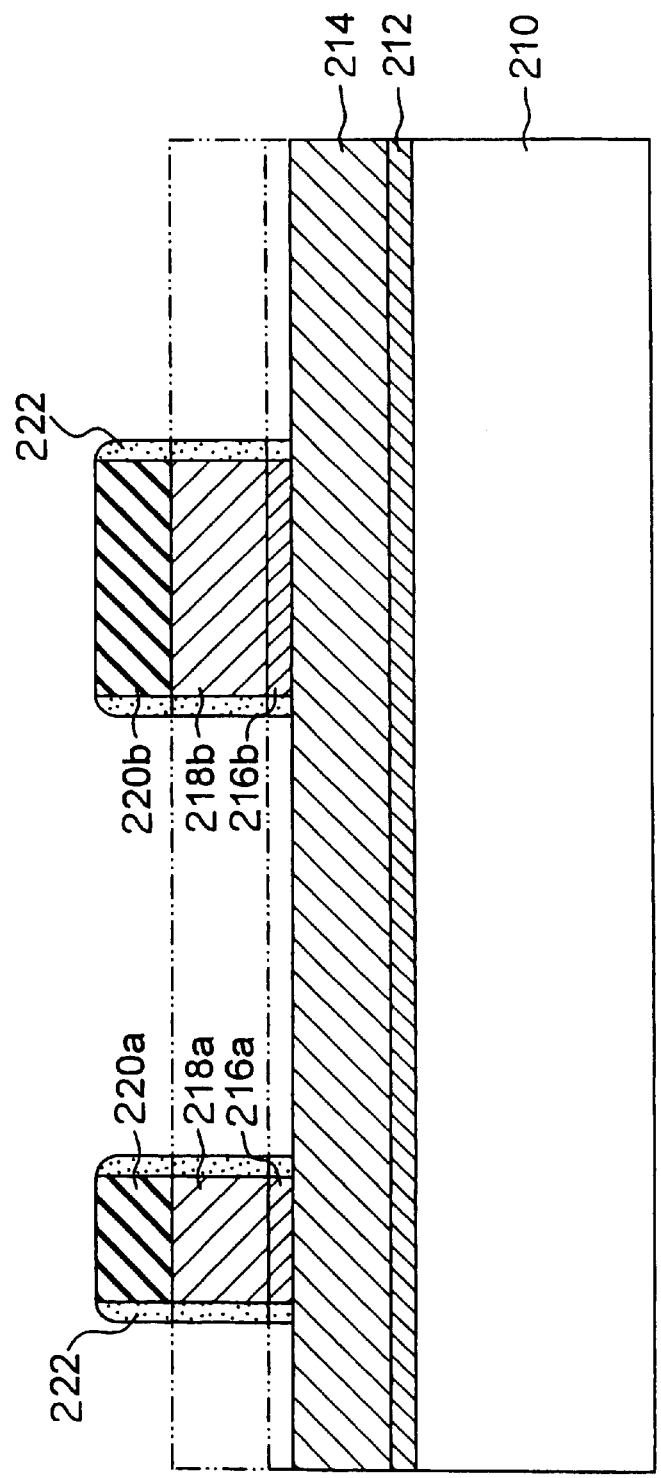
FIG. 11 is a sectional view showing a part of a process for producing the second preferred embodiment of a nonvolatile semiconductor memory device according to the present invention.

Then, as shown in FIG. 11, the resist pattern 222 is removed. Subsequently, the second polysilicon layer 218 is patterned by the RIE or the like using the mask insulator films 220a and 220b as masks to form a control gate 218a and a second gate electrode 218b. Moreover, the ONO insulator film 216 is patterned by the RIE or the like using the mask insulator films 220a and 220b as masks to form intergate insulator films 216a and 216b.

When the ONO insulator film 216 is etched, deposits 222 are formed on the side walls of the mask insulator films 220a and 220b, the side walls of the control gate 218a and second gate electrode 218b, and the side walls of the intergate insulator films 216a and 216b.

Then, as shown in FIG. 12, the deposits 222 are removed. That is, the deposits 222 are removed by the ashing and the wet treatment. At this time, a resist pattern 224 has not yet been formed, so that the ashing and the wet treatment can be carried out.

Subsequently, a resist is applied and patterned by the photo lithography to form a resist pattern 224. That is, a first gate electrode resist pattern for forming a first gate electrode is formed in a peripheral transistor forming region and/or selecting transistor forming region. The resist pattern 224 is designed so as to cover a part of the mask insulator film 220b taking account of a mating margin.

Then, as shown in FIG. 13, the first polysilicon layer 214 is etched by the RIE or the like using the resist pattern 224 and the mask insulator films 220a and 220b as masks. By this etching, a floating gate 214a and a first gate electrode 214b are formed. When the first polysilicon 214 is etched, the mask insulator films 220a and 220b are not etched since these films have a high selective etching ratio for the first polysilicon layer 214.

Figure 14:
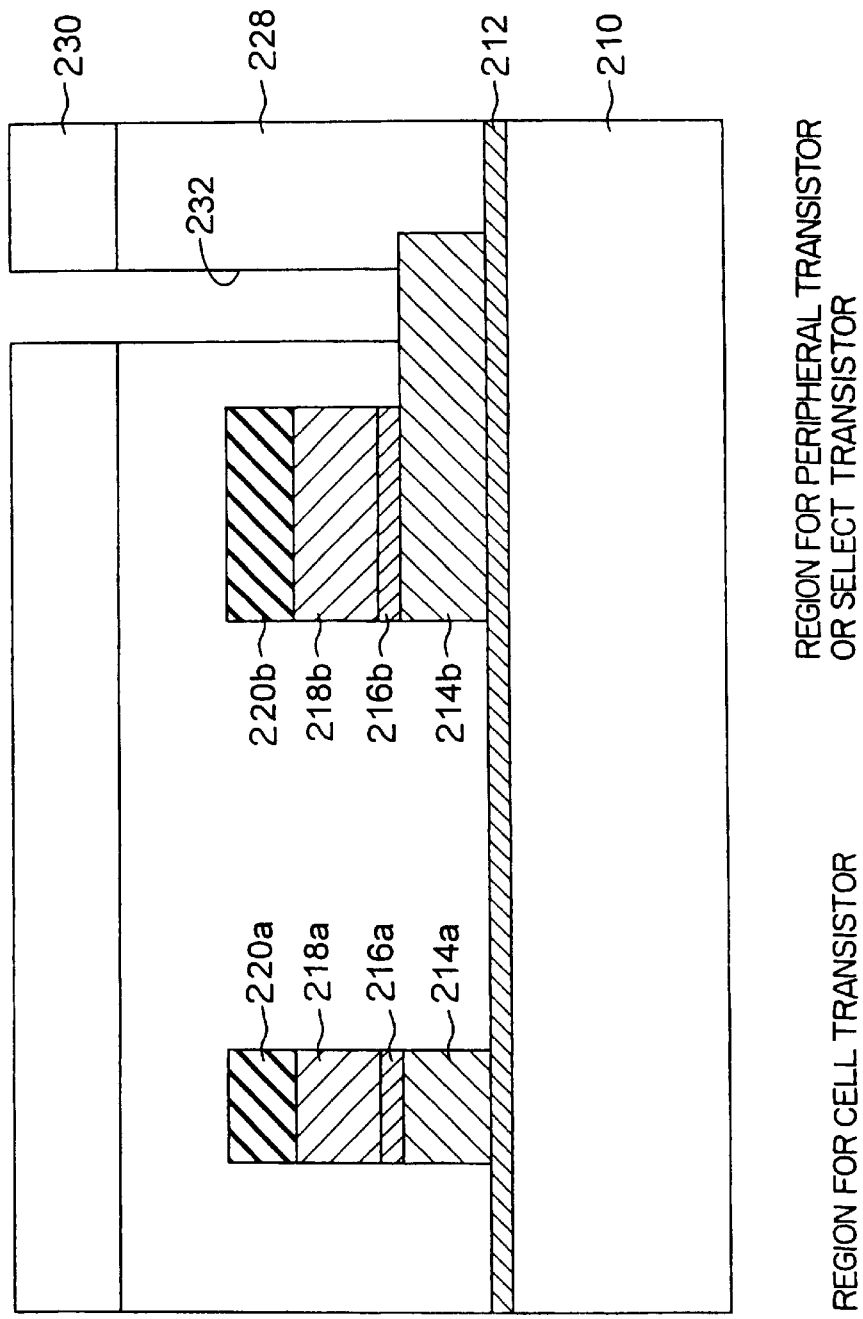
FIG. 14 is a sectional view showing a part of a process for producing the second preferred embodiment of a nonvolatile semiconductor memory device according to the present invention.

Then, as shown in FIG. 14, the resist pattern 224 is removed. Subsequently, an interlayer insulator film 228 is formed thereon. The surface of the interlayer insulator film 228 is formed so as to be flat. Subsequently, a resist is applied on the interlayer insulator film 228 and patterned by the photo lithography to form a resist pattern 230. Then, the interlayer insulator film 228 is etched by the RIE or the like using the resist pattern 230. By this etching, a contact hole 232 is formed.

Figure 15:
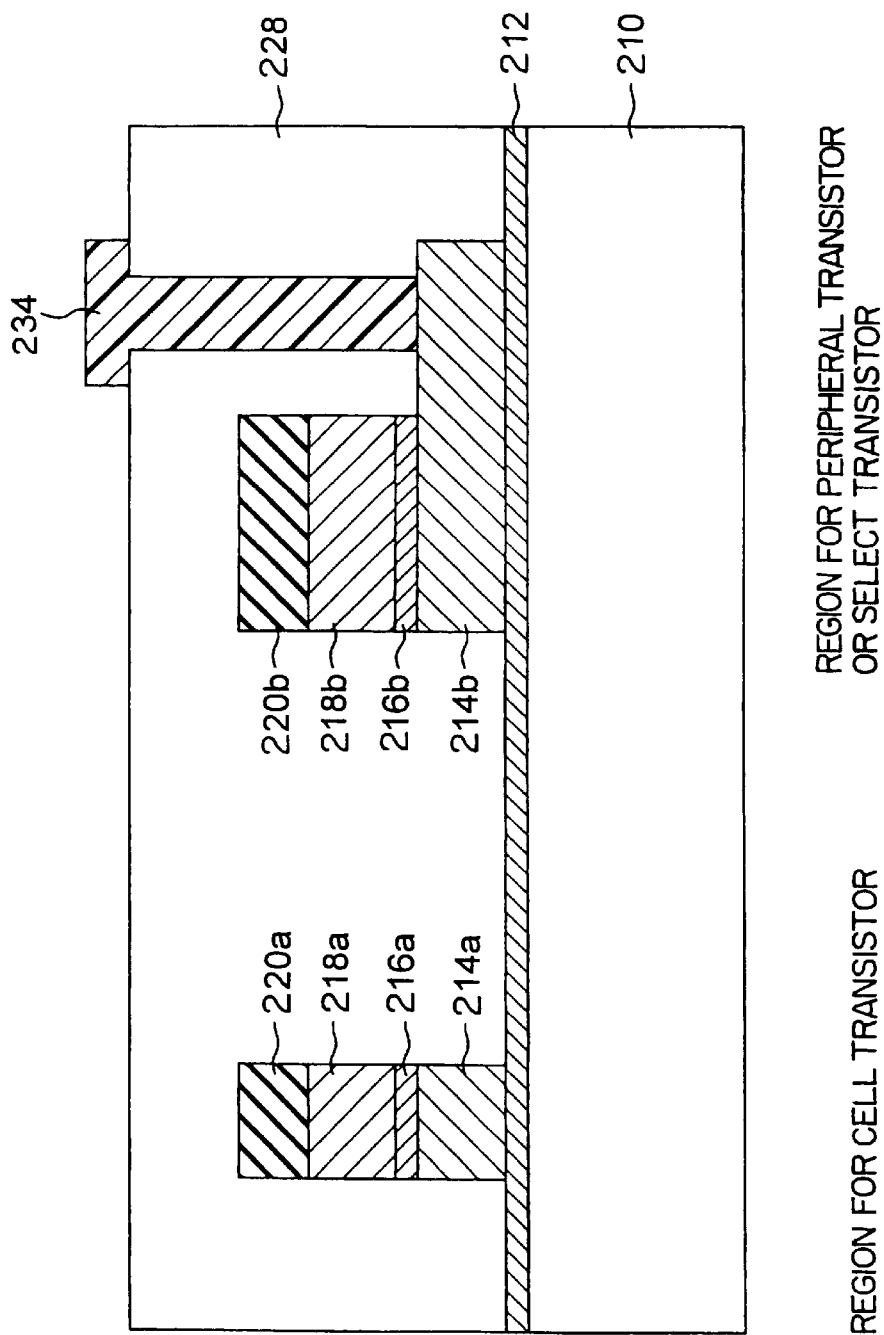
FIG. 15 is a sectional view of the second preferred embodiment of a nonvolatile semiconductor memory device according to the present invention.

Then, as shown in FIG. 15, the resist pattern 230 is removed. Subsequently, a third polysilicon layer of a conductive material having a desired value of resistance is formed to be embedded in the contact hole 232 and patterned to form a contact portion 234. As shown in FIG. 16 which is viewed from the top of FIG. 15, the surface of the interlayer insulator film 228 has no difference in level to be flattened.

As can be seen from the foregoing, according to a method for producing a nonvolatile semiconductor memory device in this preferred embodiment, the step of removing the deposits 222 can be carried out as shown in FIG. 11. That is, when the ONO insulator film 216 is etched, the deposits 222 adhere to the side walls of the mask insulator films 220a and 220b, the side walls of the control gate 218a and second gate electrode 218b, and the side walls of the intergate insulator films 216a and 216b. However, since the resist pattern 224 has not yet been formed at this time, the deposits 222 can be removed by the ashing and the wet treatment. Therefore, as shown in FIG. 13, the width L3 of the floating gate 214a can be matched with the width L4 of the control gate 218a. That is, it is possible to prevent the width of the intergate insulator films 216a and 216b from being different from the width of the floating gate 214a and the first gate electrode 214b. Moreover, by removing the deposits 222, it is possible to eliminate the problem in that the sizes of the floating gate 214a and first gate electrode 214b vary.

In addition, as shown in FIG. 15, the mask insulator film 220b has no difference in level, so that the flatness of the surface of the interlayer insulator film 228 can be ensured. If the surface of the interlayer insulator film 228 is thus flattened, it is possible to eliminate the problem in that it is difficult to align the mask for the photo lithography when the contact hole 232 is formed in the interlayer insulator film 228 as shown in FIG. 14. In addition, it is possible to prevent light from being scattered during lithography, and it is possible to ensure the margin of focus, so that it is possible to pattern the resist mask with required precision.

Moreover, since the resist pattern 224 is formed on the first polysilicon layer 214 as shown in FIG. 12, adhesion between both is good. That is, it is possible to form the resist on the polysilicon having better adhesion than that of the ONO insulator film. Therefore, it is possible to eliminate the problem in that the resist pattern 224 is peeled off and the resist flies off.

Furthermore, the present invention should not be limited to the above described preferred embodiments, and the invention may be modified in various ways. For example, in the above described preferred embodiment, the floating gate 214a has been formed of a polysilicon, the intergate insulator film 216a has been formed of an ONO film, and the mask insulator film 220a has been formed of a nitride or oxide system film. However, the present invention should not be limited to this combination. For example, the floating gate 214a may be formed of amorphous silicon, the intergate insulator film 216a may be formed of a monolayer oxide film, NO film, high dielectric film or the like, and the mask insulator film may be a film having a high selective etching ratio with polysilicon, such as a laminated film of nitride and oxide films or carbon.

In addition, while the deposits 222 have been removed in the above described preferred embodiment as shown in FIGS. 11 and 12, it is not always required to carry out this treatment. That is, it is possible to flatten the surface of the interlayer insulator film 228 without the need of the removal of the deposits 222.

As described above, according to the present invention, it is possible to provide a method for producing a nonvolatile semiconductor memory device wherein the surface of an interlayer insulator film is flattened and wherein the resist pattern is not peeled off and does not fly off, and a nonvolatile semiconductor memory device produced by this method.

What is claimed is:

1. A nonvolatile semiconductor memory device having a cell transistor and a non-cell transistor which is a transistor other than said cell transistor, said cell transistor and said non-cell transistor being covered with an interlayer insulator film, wherein said non-cell transistor comprises:
    a first insulator film formed on a semiconductor substrate;
    a first gate electrode formed on said first insulator film;
    a second insulator film formed on said first gate electrode in a first area of said first gate electrode, said first area being a part of said first gate electrode;
    a second gate electrode formed on said second insulator film; and
    a contact portion embedded in a contact hole of said interlayer insulator film to contact said first gate electrode in a second area of said first gate electrode, wherein said second insulator film is not formed on said second area and said contact portion is out of contact with said second insulator film.

2. The nonvolatile semiconductor memory device as set forth in claim 1, further comprising a transistor mask film formed on said second gate electrode, wherein a surface of said transistor mask is flat.

3. The nonvolatile semiconductor memory device as set forth in claim 2, wherein at least one side edges of said first gate electrode, said second insulator film, said second gate electrode and said transistor mask film are matched with one another.

4. The nonvolatile semiconductor memory device as set forth in claim 3, wherein said cell transistor comprises:

a floating gate formed on said first insulator film;

a third insulator film formed on said floating gate;

a control gate formed on said third insulator film; and a cell mask film formed on said control gate.

5. The nonvolatile semiconductor memory device as set forth in claim 4, wherein a width of said floating gate is substantially the same as that of said control gate.

6. The nonvolatile semiconductor memory device as set forth in claim 5, wherein a material of said first gate electrode is the same as that of said floating gate, a material of said second insulator film is the same as that of said third insulator film, a material of said second gate electrode is the same as that of said control gate, and a material of said transistor mask film is the same as that of said cell mask film.

7. The nonvolatile semiconductor memory device as set forth in claim 6, wherein each of said second insulator film and said third insulator film is a laminated film formed of an oxide film, a nitride film and an oxide film.

8. The nonvolatile semiconductor memory device as set forth in claim 6, wherein each of said second insulator film and said third insulator film is a laminated film containing at least a nitride film.

9. The nonvolatile semiconductor memory device as set forth in claim 1, wherein said second insulator film is a laminated film formed of an oxide film, a nitride film and an oxide film.

10. The nonvolatile semiconductor memory device as set forth in claim 1, wherein said second insulator film is an laminated film containing at least a nitride film.

11. The nonvolatile semiconductor memory device as set forth in claim 1, wherein a surface of said interlayer insulator film is flat.

12. The nonvolatile semiconductor memory device as set forth in claim 1, wherein said cell transistor comprises:

a gate insulator film formed on the semiconductor substrate, wherein the thickness of said gate insulator film is substantially the same as the that of said first insulator film; and a floating gate formed on said gate insulator film.

* * * * *